(12) United States Patent
Funayoshi et al.

(10) Patent No.: US 12,390,978 B2
(45) Date of Patent: Aug. 19, 2025

(54) IMPRINT METHOD AND METHOD FOR MANUFACTURING ARTICLE

(71) Applicant: CANON KABUSHIKI KAISHA, Tokyo (JP)

(72) Inventors: Tomomi Funayoshi, Tokyo (JP); Ryosuke Hamamoto, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/319,191

(22) Filed: May 13, 2021

(65) Prior Publication Data

US 2021/0362399 A1    Nov. 25, 2021

(30) Foreign Application Priority Data

May 21, 2020    (JP) ................................ 2020-088834

(51) Int. Cl.
*G03F 7/00*     (2006.01)
*B29C 35/08*    (2006.01)
(Continued)

(52) U.S. Cl.
CPC .......... *B29C 59/16* (2013.01); *B29C 35/0805* (2013.01); *B29C 35/0894* (2013.01); *B29C 59/022* (2013.01)

(58) Field of Classification Search
CPC ..... B29C 59/16; B29C 59/022; G03F 7/0002; G03F 7/2012; G03F 7/00; G03F 7/0017;
(Continued)

(56) References Cited

U.S. PATENT DOCUMENTS 6,753,131 B1 * 6/2004 Rogers ................. G03F 7/0002
                                                                430/22
8,850,980 B2   10/2014 Sreenivasan
(Continued)

FOREIGN PATENT DOCUMENTS

JP       5184508 B2    4/2013
JP     2015144193 A    8/2015
(Continued)

OTHER PUBLICATIONS

Office Action issued in Korean Appln. No. 10-2021-0061108 mailed Aug. 23, 2024. English translation provided.

*Primary Examiner* — Galen H Hauth
*Assistant Examiner* — Baileigh Kate Darnell
(74) *Attorney, Agent, or Firm* — ROSSI, KIMMS & McDOWELL LLP

(57) ABSTRACT

In order to realize an imprint method capable of reducing a drawback caused by protrusion of an imprint material, the imprint method includes a first pattern forming process of bringing a mold into contact with an imprint material on a first pattern forming region on a substrate; a first exposure process of exposing an imprint material on the first pattern forming region and making an amount of exposure for the imprint material on a partial region of the first pattern forming region smaller; a second pattern forming process of bringing the mold into contact with an imprint material on a second pattern forming region after the first pattern forming process to form a pattern; and a second exposure process of exposing the imprint material on the second pattern forming region and the imprint material on the partial region of the first pattern forming region.

12 Claims, 7 Drawing Sheets

(51) Int. Cl.
B29C 59/02 (2006.01)
B29C 59/16 (2006.01)
G03F 7/20 (2006.01)

(58) Field of Classification Search
CPC .... G03F 7/0035; G03F 7/2047; G03F 7/7035; G03F 7/7045; G03F 9/00; G03F 9/7042; G03G 15/225
See application file for complete search history.

(56) References Cited

U.S. PATENT DOCUMENTS

| | | |
|---|---|---|
| 10,935,883 B2 | 3/2021 | Tavakkoli |
| 2008/0237936 A1* | 10/2008 | Park ................ B29C 37/0053 264/494 |
| 2009/0047604 A1* | 2/2009 | Stoeldraijer ........ G03F 7/70425 430/311 |
| 2009/0189306 A1* | 7/2009 | Terasaki ................ B82Y 10/00 264/293 |
| 2009/0224436 A1* | 9/2009 | Mikami ................ B82Y 40/00 264/447 |
| 2010/0233432 A1* | 9/2010 | Okushima ............ G03F 7/0002 428/156 |
| 2011/0065254 A1 | 3/2011 | Yoneda et al. |
| 2013/0059090 A1* | 3/2013 | Kawamura .......... C09D 133/08 522/111 |
| 2015/0221501 A1 | 8/2015 | Tsuji et al. |
| 2016/0179008 A1* | 6/2016 | Heller ...................... G03F 7/26 430/271.1 |
| 2017/0157836 A1* | 6/2017 | Miyazawa ............. B29C 59/02 |
| 2018/0299772 A1* | 10/2018 | Jung ..................... G03F 7/0002 |

FOREIGN PATENT DOCUMENTS

| | | |
|---|---|---|
| JP | 2019068051 A | 4/2019 |
| JP | 2019075551 A | 5/2019 |
| WO | 2016006592 A1 | 1/2016 |

* cited by examiner

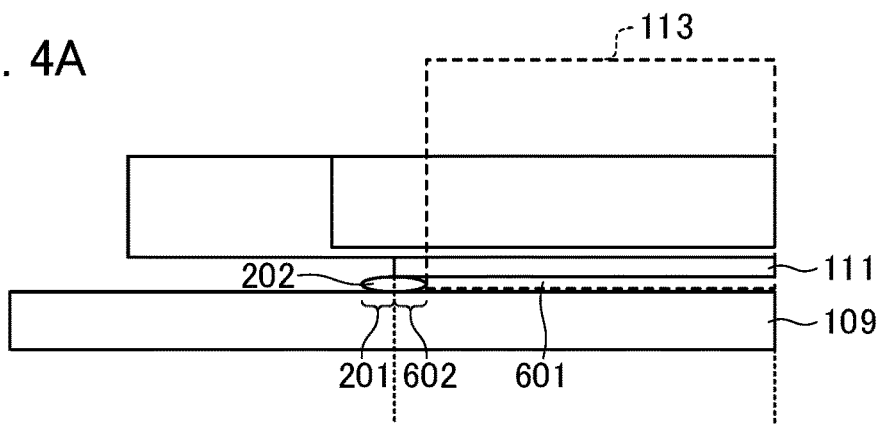
FIG. 4A
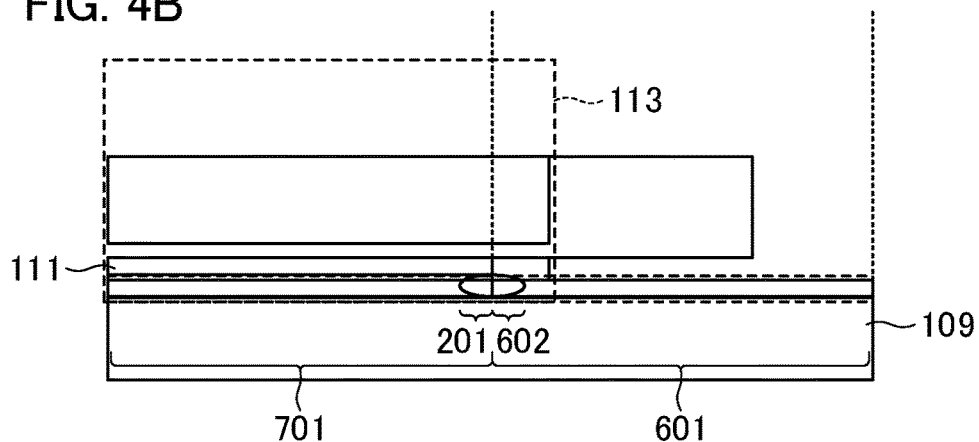
FIG. 4B
FIG. 4C
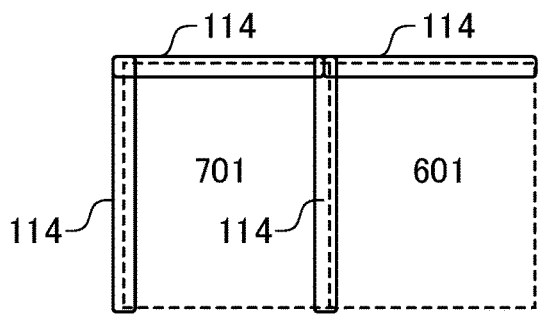
FIG. 4D
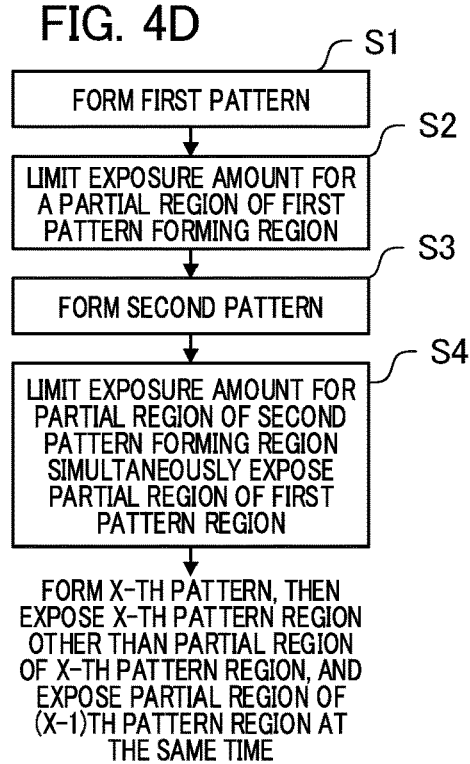

FIG. 7

| 0 | 0 | 0 | 0 | 0 | 0 | 0 | 0 | 0 | 0 | 0 | 0 | 0 |
|---|---|---|---|---|---|---|---|---|---|---|---|---|
| 0 | 0 | 0.5 | 0.5 | 0.5 | 0.5 | 0.5 | 0.5 | 0.5 | 0.5 | 0.5 | 0.5 | 0.5 |
| 0 | 0 | 0.5 | 0.5 | 0.5 | 0.5 | 0.5 | 0.5 | 0.5 | 0.5 | 0.5 | 0.5 | 0.5 |
| 0 | 0 | 0.5 | 0.5 | 1 | 1 | 1 | 1 | 1 | 1 | 1 | 1 | 1 —117 |
| 0 | 0 | 0.5 | 0.5 | 1 | 1 | 1 | 1 | 1 | 1 | 1 | 1 | 1 |
| 0 | 0 | 0.5 | 0.5 | 1 | 1 | 1 | 1 | 1 | 1 | 1 | 1 | 1 |
| 0 | 0 | 0.5 | 0.5 | 1 | 1 | 1 | 1 | 1 | 1 | 1 | 1 | 1 |
| 0 | 0 | 0.5 | 0.5 | 1 | 1 | 1 | 1 | 1 | 1 | 1 | 1 | 1 |
| 0 | 0 | 0.5 | 0.5 | 1 | 1 | 1 | 1 | 1 | 1 | 1 | 1 | 1 —108 |
| 0 | 0 | 0.5 | 0.5 | 1 | 1 | 1 | 1 | 1 | 1 | 1 | 1 | 1 |
| 0 | 0 | 0.5 | 0.5 | 1 | 1 | 1 | 1 | 1 | 1 | 1 | 1 | 1 |
| 0 | 0 | 0.5 | 0.5 | 1 | 1 | 1 | 1 | 1 | 1 | 1 | 1 | 1 |
| 0 | 0 | 0.5 | 0.5 | 1 | 1 | 1 | 1 | 1 | 1 | 1 | 1 | 1 |
| 0 | 0 | 0 | 0 | 0 | 0 | 0 | 0 | 0 | 0 | 0 | 0 | 0 |

IMPRINT METHOD AND METHOD FOR MANUFACTURING ARTICLE

BACKGROUND OF THE INVENTION

Field of the Invention

The present invention relates to an imprint method and a method for manufacturing an article.

Description of the Related Art

An imprint apparatus brings an imprint material disposed on a substrate into contact with a mold on which a pattern has been formed, and exposes the imprint material with light or the like to cure the material to form a pattern consisting of the cured imprint material on the substrate. In the imprint apparatus, since a pressure of the mold is applied to the imprint material when the imprint material disposed in a shot region on the substrate is brought into contact with the mold, the imprint material spreads to cause a situation in which the imprint material protrudes at the outside of a pattern region.

In such a situation in which the imprint material protrudes, there are cases in which the protruding imprint material becomes higher than the height of a pattern to be formed and is cured by exposure light. Subsequently, during the pressing of the next adjacent shot, the mold may press the protruded imprint material that has been cured. In that case, the protruded imprint material that has been cured may peel off and become particles that contaminate the apparatus or damage the mold.

Furthermore, due to a frictional force generated when the cured imprint material is pressed during the die-by-die alignment. the control of alignment may become disturbed, and a delay in the convergence may be caused. Additionally, in the subsequent processes, a defect may occur due to the particles. Accordingly, in order to avoid the above drawbacks, Japanese Unexamined Patent Application No. 2019-068051 discloses that a light shielding material is disposed on a mold to prevent light from being applied to a region where the imprint material protrudes, which is outside a pattern region, to prevent the imprint material disposed outside the pattern region from being cured.

In contrast, as disclosed in Japanese Patent No. 5184508, a mold used during imprint needs to be shaped so as not to generate an open region at the boundary of adjacent shots when an imprint is performed in a grid-shape. However, even if the light shielding material is disposed on the mold, exposure light enters the boundary between the light shielding material and the pattern region, and causes a situation in which the protruding imprint material is cured.

SUMMARY OF THE INVENTION

In view of the above drawback, the object of the present invention is to provide an imprint method that can reduce the drawback caused by the protrusion of an imprint material. In order to solve the above drawback, an imprint method according to one aspect of the present invention comprises:
a first pattern forming process of bringing a mold having a pattern into contact with an imprint material on a first pattern forming region on a substrate to form a pattern; a first exposure process of exposing an imprint material on the first pattern forming region in which the pattern has been formed by the first pattern forming process and making an amount of exposure for the imprint material on a partial region of the first pattern forming region smaller than an amount of exposure for the imprint material on the other region of the first pattern forming region; a second pattern forming process of bringing the mold into contact with an imprint material on a second pattern forming region on the substrate after the first pattern forming process to form a pattern; and a second exposure process of exposing the imprint material on the second pattern forming region in which the pattern has been formed by the second pattern forming process, and exposing the imprint material on the partial region of the first pattern forming region.

Further features of the present invention will become apparent from the following description of embodiments with reference to the attached drawings.

BRIEF DESCRIPTION OF THE DRAWINGS

FIGS. 1A to 1C are schematic diagrams illustrating a drawback in the prior art, in which FIG. 1A is an overall view for illustrating a device configuration and the protrusion of an imprint material that causes problems, FIG. 1B is a partially enlarged view thereof, and FIG. 1C illustrates a state in which the protruding imprint material is cured.

FIGS. 3A and 3B illustrate examples of a pattern region and an exposure region of a mold, in which FIG. 3A illustrates an example of the pattern forming region shaped in a rectangle consisting of straight sides and FIG. 3B illustrates an example of the pattern forming region in which the shape of each side is not straight.

FIG. 4A illustrates an exposure region in forming a first pattern and FIG. 4B illustrates an exposure region in forming a second pattern that is adjacent to the first pattern after the first pattern has been formed. FIG. 4C illustrates region 114 in which no exposure or a lowered exposure is performed during respective formation of the patterns of a first pattern forming region 601 and a second pattern forming region 701, which are viewed from above, and FIG. 4D is a flowchart of an exposure operation for each pattern forming region in pattern formation.

FIG. 7 illustrates an example of arrangement of DMD elements of Embodiment 3.

DESCRIPTION OF THE EMBODIMENTS

Figure 1A:
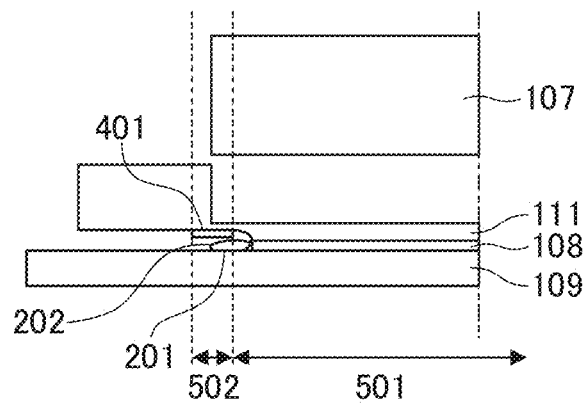

Hereinafter, preferred embodiments of the present invention will be described with reference to the accompanying drawings. In each of the drawings, the same members or components are denoted by the same reference numerals, and redundant descriptions are omitted or simplified. An imprint apparatus of the present embodiment is an apparatus that applies light energy for curing to an imprint material while bringing an imprint material supplied on a substrate into contact with a mold, thereby resulting in forming a pattern of a cured material onto which a convex and concave pattern of the mold is transferred.

Figure 1B:
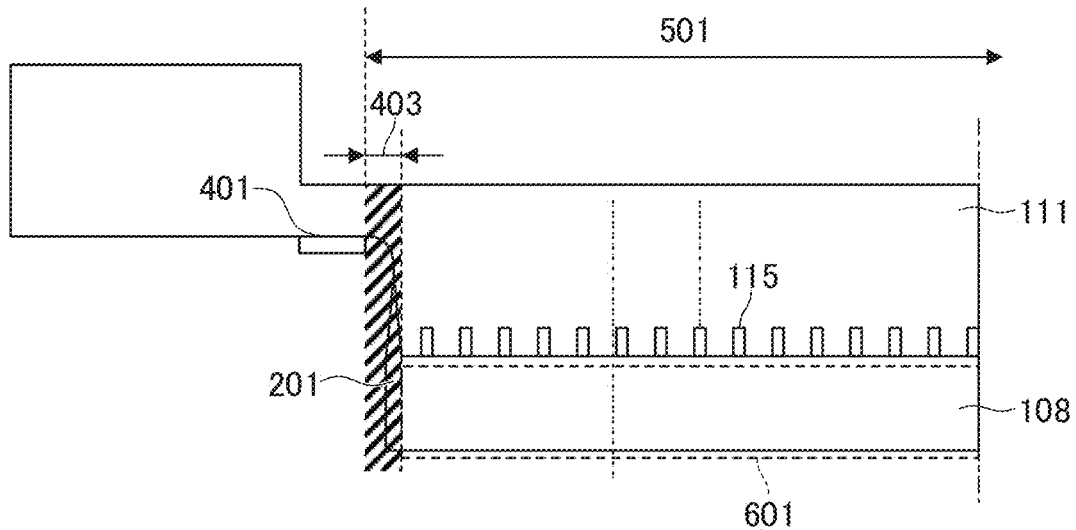
Figure 1C:
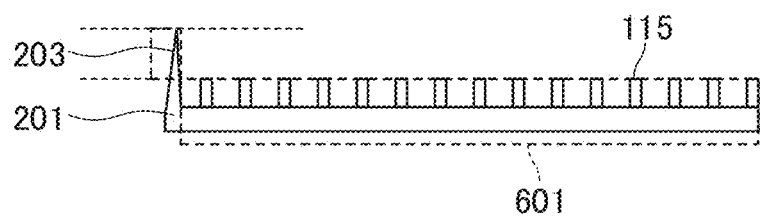

FIG. 1A is a schematic view illustrating a drawback in the prior art, in which FIG. 1A is an overall view illustrating a device configuration and the protrusion of an imprint material that causes a disadvantage. FIG. 1B is a partially enlarged view of FIG. 1A. FIG. 1C illustrates a state in which the protruding imprint material is cured.

In FIG. 1, reference numeral 107 denotes a lens optical system, reference numeral 108 denotes an imprint material, reference numeral 109 denotes a substrate, reference numeral 111 denotes a mold, and reference numeral 115 denotes a pattern portion. Reference numeral 201 denotes an imprint material protruding at the outside of a pattern region, reference numeral 202 denotes an uncured imprint material, and reference numeral 203 denotes an imprint material that has been cured at a height higher than the pattern height. Reference numeral 401 denotes a light shielding material, reference numeral 403 denotes a boundary region between a glass portion and a light shielding material, reference numeral 501 denotes an exposure light irradiation region, reference numeral 502 denotes a non-exposure region, and reference numeral 601 denotes a first pattern forming region.

As shown in FIG. 1, in a process of forming a pattern by pressing the imprint material 108 onto the mold 111 and curing the imprint material, the imprint material 201 protrudes to the outside of the first pattern forming region 601. The protruding imprint material 201 is cured in the boundary region 403 between the glass portion and the light shielding material 401 of the mold. Specifically, as shown in FIG. 1C, there is a case in which the protruded and cured imprint material 203 higher than the pattern is formed. The present embodiment is intended to solve the above drawback.

Embodiment 1

Figure 2:
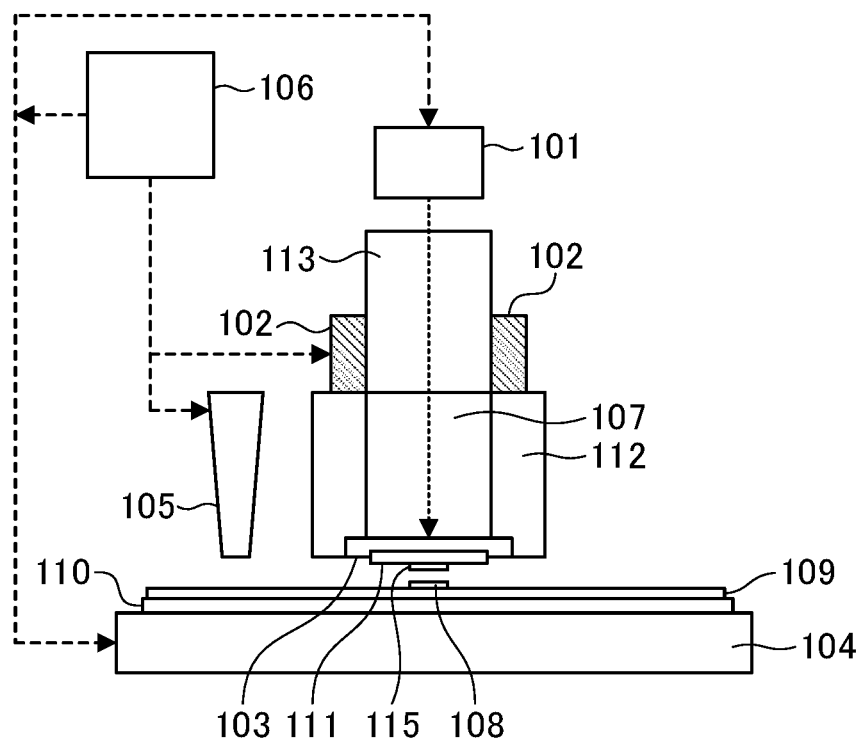
FIG. 2 is an imprint apparatus according to Embodiment 1.

FIG. 2 illustrates a configuration of the imprint apparatus according to the embodiment, and a configuration of the imprint apparatus according to the embodiment will be described with reference to FIG. 2. The imprint apparatus of FIG. 2 includes an exposure light source 101, an opening mechanism 102 for partially limiting the periphery of the exposure light and allowing the exposure light to pass therethrough, a mold holding mechanism 103, a substrate stage 104, an imprint material applying unit 105, and a controller 106. A CPU serving as a computer is incorporated in the controller 106, and functions as a control means for executing various operations for the entire apparatus based on a computer program stored in a memory.

The exposure light is limited by the opening mechanism 102 to a rectangular shape having a desired size, passes through the lens optical system 107, and the imprint material on the substrate 109 is irradiated with the exposure light. The substrate 109 is mounted on a substrate chuck 110 on the substrate stage 104. After a desired shot position on the substrate 109 is moved to a position right under the imprint material applying unit 105 by driving the substrate stage 104, the imprint material 108 is applied by the imprint material applying unit 105.

Next, the shot position where the imprint material 108 has been applied is moved to a position right under the mold 111. Subsequently, the mold 111 in which the pattern portion 115 is disposed underneath is lowered by a mold driving mechanism 112 and brought into contact with the substrate 109 onto which the imprint material 108 has been applied. In this contacting state, irradiation with an exposure light beam 113 is performed, and a pattern made of a cured imprint material is formed.

Figure 3A:
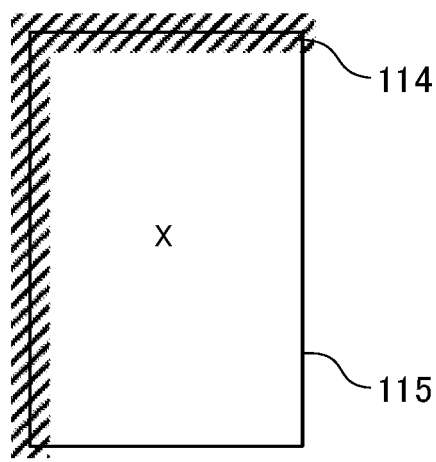
Figure 3B:
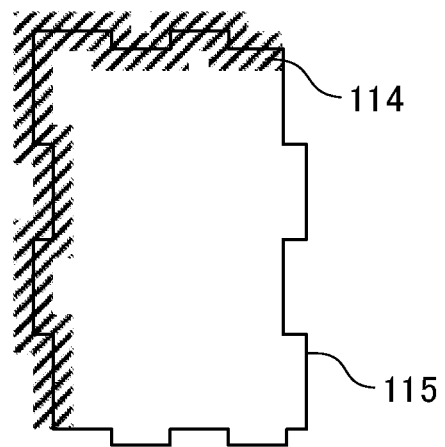

FIG. 3 illustrates an example of a pattern forming region and exposure region in a mold. As described above, the mold 111 has the pattern portion 115 for forming a pattern, and a region in which a pattern is formed by the pattern portion 115 is referred to as a "pattern forming region". FIG. 3A illustrates an example of a rectangle in which the shape of each side of the pattern forming region is straight line, and FIG. 3B illustrates an example in which the shape of each side is not straight.

In the present embodiment, the exposure light amount for the partial region 114 of the pattern forming region is set lower than the exposure light amount for the other portion of the pattern forming region to perform control so that the imprint material 108 that has protruded at the periphery of the region 114 is not fully cured. The region 114 shown as a portion of the pattern region shown in FIG. 3 is an example. The region 114 is preferably a region that does not correspond to a circuit pattern or a mark such as an alignment mark of the mold.

Specifically, in FIG. 3A, the region 114 is linearly disposed along the boundary portion of the pattern forming region, and in FIG. 3B, the region 114 is disposed along the side that is not straight. If a mark is disposed near the region 114, it is necessary to prevent an exposure light amount for the mark portion from being lowered. Hence, a process, for example, of partially exposing the periphery of the mark portion later is added. Alternatively, the region 114 is disposed so as not to overlap with the mark part.

FIG. 4 illustrates an exposure region during pattern formation, and illustrates an exposure region when a pattern is sequentially formed on the substrate while an exposure amount for the pattern region is limited as shown in FIG. 3. FIG. 4A illustrates the case in which a first pattern is formed, and FIG. 4B illustrates the case in which a second pattern that is adjacent to the first pattern is subsequently formed after the first pattern has been formed.

In FIG. 4A, in forming the first pattern, the opening mechanism 102 narrows the exposure light beam 113. That is, as shown in the exposure light beam 113 of FIG. 4A, an end portion 602 of the first pattern forming region 601 and the imprint material 201 protruding at the region outside the end portion 602 of the first pattern forming region 601 are not exposed or the exposure amount thereto is limited. Specifically, either an exposure is not performed or irradiation with a low exposure light amount is performed. Here, the end portion 602 of the first pattern forming region 601 is set at the left end of the first pattern forming region 601 in FIG. 4B, which is next to the second pattern forming region 701.

Subsequently, in FIG. 4B, in forming a pattern in the second pattern forming region 701 that is adjacent to the first pattern forming region 601, the end portion 602 of the first pattern forming region 601 that is adjacent to the second pattern forming region 701 is exposed, as shown by the exposure light beam 113. Hence, the imprint material of the end portion 602 is securely cured.

FIG. 4C illustrates the regions 114 in which no exposure or a lowered exposure is performed during respective formation of the patterns of the first pattern forming region 601 and the second pattern forming region 701, which are viewed from above. FIG. 4D illustrates a flowchart of exposure operation for each pattern forming region in pattern formation.

In the flowchart of FIG. 4D, step S1 is a first pattern forming process and, as shown in FIG. 4A, an imprint material is applied to the first pattern forming region and the mold is brought into contact with the imprint material of the first pattern forming region to form a first pattern. That is, the mold having a pattern is brought into contact with the imprint material on the first patterning region on the substrate to form the first pattern.

Step S2 is a first exposure process in which the exposure light beam 113 is narrowed by the opening mechanism 102 of FIG. 2, a portion other than the end portion 602 of the first pattern forming region 601 is exposed, and the end portion 602 and the imprint material 201 protruding at the outer region of the end portion 602 are not exposed or are irradiated with a low exposure light amount. That is, the imprint material on the first pattern forming region where the pattern has been formed by the first pattern forming process is exposed. However, the amount of exposure of the imprint material on a partial region of the first pattern forming region is made smaller than the amount of exposure of the imprint material in the other region of the first pattern forming region.

Step S3 is a second pattern forming process in which the imprint material is applied to the second pattern forming region, and then the mold is brought into contact with the second pattern forming region to form the second pattern. That is, after the first pattern forming process, the mold is brought into contact with the imprint material on the second pattern forming region on the substrate to form the second pattern. At this time, in the second pattern forming process, the mold is pressed against the imprint material protruding, if any, at the outside of the first pattern forming region.

Step S4 is a second exposure process, in which a portion other than the left end portion (114 in FIG. 4C) in the second pattern forming region 701 is exposed with the exposure light beam 113 shown in FIG. 4B, and the left end portion (114 in FIG. 4C) and the region outside thereof are not exposed or are irradiated with a low exposure amount. Additionally, the imprint material on the second pattern forming region in which the pattern has been formed by the second pattern forming process and the imprint material on the partial region of the first pattern forming region are exposed.

Consequently, the imprint material on the end portion 602 of the first pattern forming region is reliably cured. In subsequent steps, X-th (where X is an integer) pattern is formed, then, the imprint material on the X-th pattern region other than the partial region of the X-th pattern region is exposed, while the partial region of the (X−1)th pattern region is simultaneously exposed, and such processes are repeated.

Embodiment 2

Figure 5:
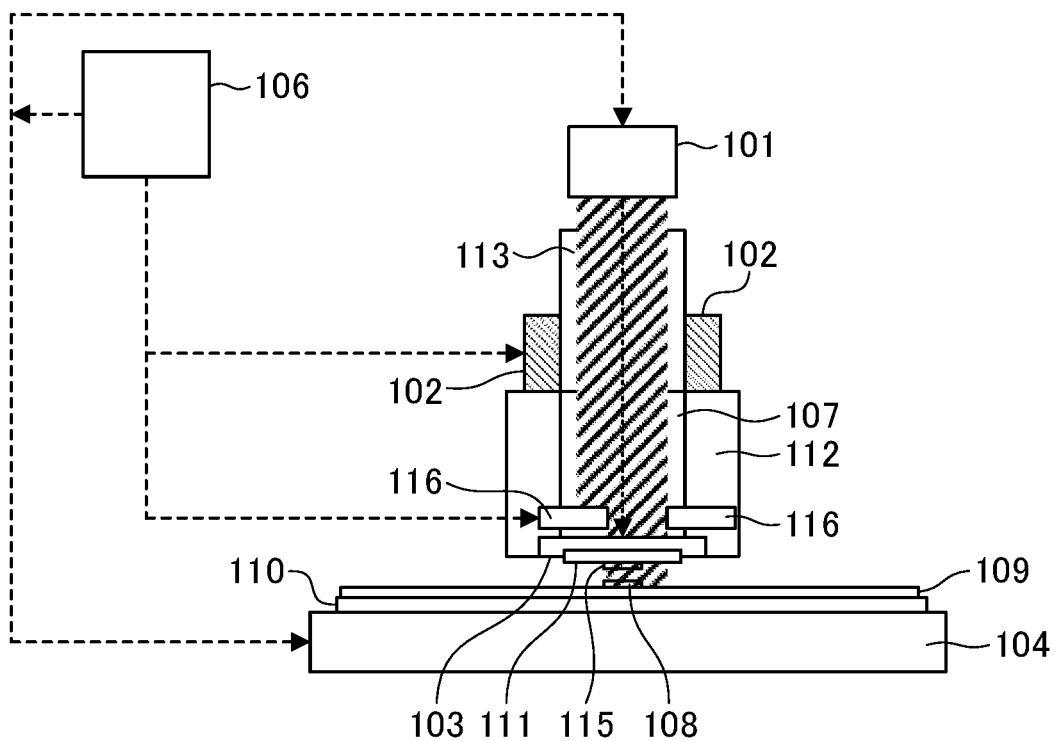
FIG. 5 is a schematic diagram of the imprint apparatus of Embodiment 2.
Figure 6A:
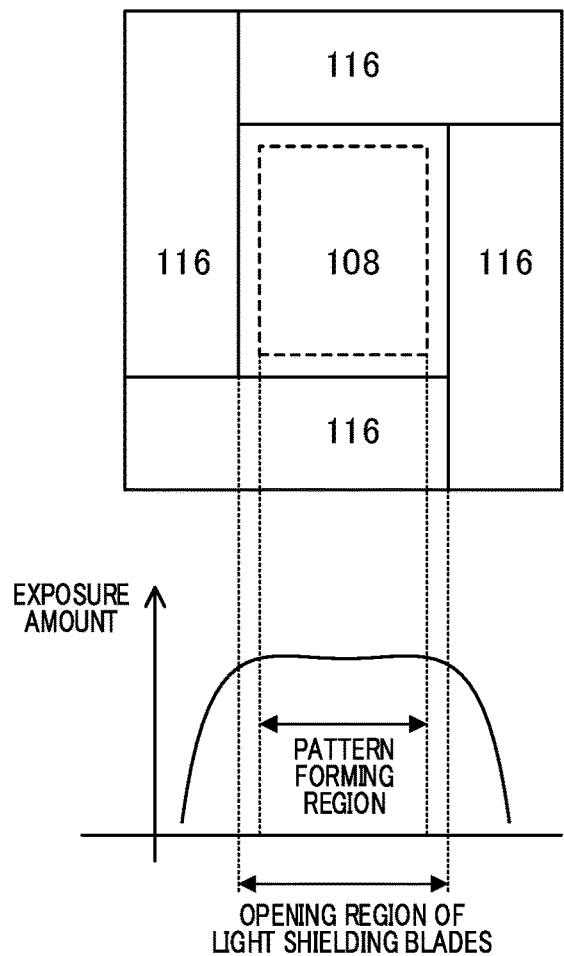
FIG. 6A illustrates the case in which, in Embodiment 2, light shielding blades 116 are set such that even amounts of exposure light are provided to the whole pattern forming region applied with the imprint material 108.

FIG. 5 is a schematic diagram of the imprint apparatus of Embodiment 2. In Embodiment 2, in addition to the opening mechanism 102, the light shielding blades 116 are disposed between the light source and the mold, and the exposure amount for the partial region 114 in the pattern forming region to which the imprint material 108 has been applied is limited (an exposure is not performed or irradiation with a low exposure amount is performed). FIG. 6 illustrates the operation of the light shielding blade of Embodiment 2, and FIG. 6A illustrates the case in which, in Embodiment 2, the light shielding blades 116 are set such that exposure light are evenly provided to the whole pattern forming region to which the imprint material 116 has been applied.

Figure 6B:
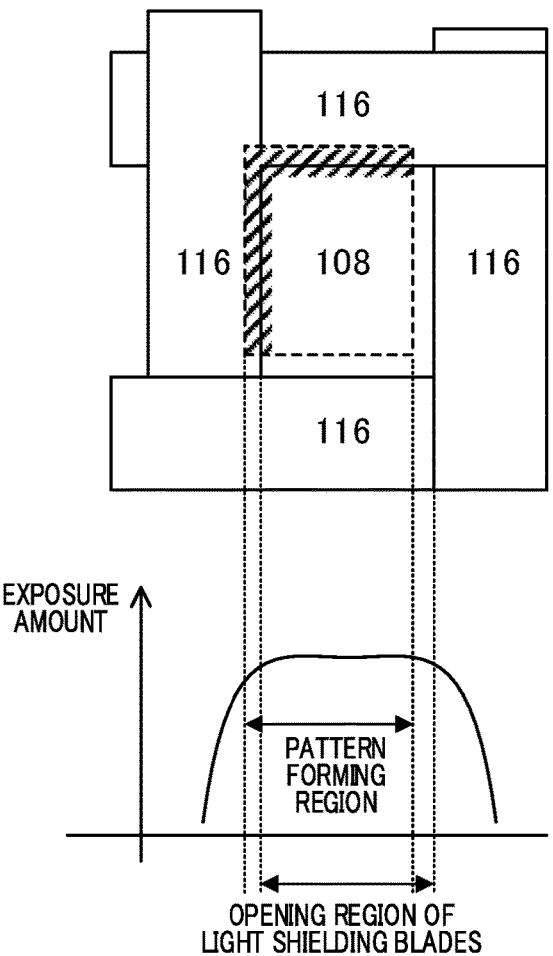
FIG. 6B illustrates the case in which the light shielding blades 116 are set so as to limit the exposure amount to a part of the imprint material 108 in the pattern forming region to which the imprint material has been applied.

At this time, the opening region of the light shielding blades 116 is set larger than the imprint material 108 of the pattern forming region. FIG. 6B illustrates the case in which the light shielding blades 116 are set to limit the amount of exposure for a portion of the imprint material 108 of the pattern forming region to which the imprint material has been applied. At this time, the opening region of the light shielding blades is set equal to or narrower than the imprint material 108 of the pattern forming region.

Embodiment 3

In Embodiment 3, as a technique for limiting the exposure amount, control is performed so as to partially change the exposure amount for an arbitrary region in the pattern forming region by using a DMD (Digital Micromirror Device) as a light source. That is, in the present embodiment, the exposure amount for the partial region of the pattern forming region is limited by using the DMD. FIG. 7 illustrates an example of an arrangement of the DMD elements of Embodiment 3. In Embodiment 3, as shown in FIG. 7, a plurality of DMD elements 117 is arranged above the imprint material 108 on the pattern forming region surrounded by a dashed line by using the DMD as a light source. In FIG. 7, each small square represents a DMD element 117.

The numeral in each DMD element 117 in FIG. 7 indicates the light intensity of each DMD element 117. By setting the light intensity as shown in FIG. 7, the exposure amount distribution can be provided to the pattern forming region. In step S2 of FIG. 4D, the light intensity of each DMD element 117 in the region corresponding to the region 114 in FIG. 4C is set smaller than that of the other region in the first pattern forming region, and as a result, the exposure amount to the region 114 can be limited.

At this time, as in the region 114 of FIG. 4C, a region in which an exposure is not performed or irradiation with a low exposure amount is performed in the pattern forming region is set to either the upper side or the lower side, and either the left side or the right side, from among the upper, lower, right, and left sides of the pattern forming region in the drawing.

In this context, a region in which an exposure is not performed or irradiation with a low exposure amount is performed in the pattern forming region is set based on the order (direction) when a pattern is sequentially formed in each shot region on the substrate. Specifically, the partial region of the first pattern forming region is a region at the end portion of the first pattern forming region in the direction of the pattern forming region to be pattern-formed at the next and subsequent times. In other words, the partial region of the first pattern forming region is set at the end of the first pattern forming region, and the partial region is next to the second or subsequent pattern forming region.

Figure 8:
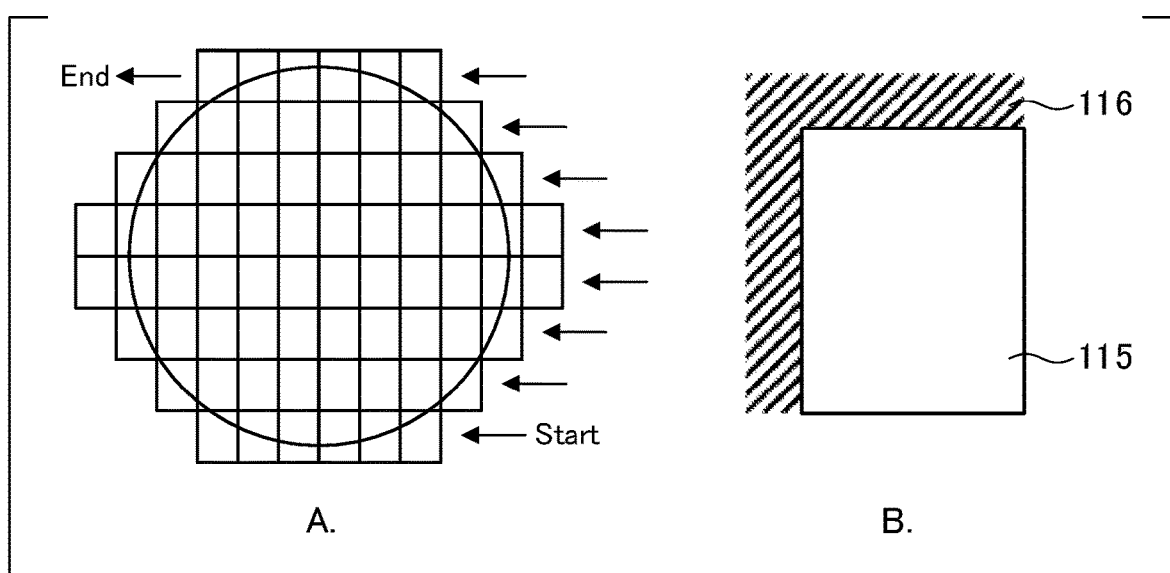
FIG. 8 illustrates an example of setting a region in which no exposure a lowered exposure is performed.

FIG. 8 illustrates a setting example of a region in which an exposure is not performed or an irradiation with a low exposure amount is performed. In the first pattern forming process, for example, a description will be given of a case in which the light shielding blades 116 are used as an example in order to make the partial region 114 non-exposed or to make the partial region 114 irradiated with a lower exposure amount than the other region. Instead of the light shielding blades 116, a light shielding material may be disposed on the mold.

In FIG. 8, regarding the position of a region in which an exposure is not performed or an irradiation with a low exposure amount is performed, either the upper side or the lower side, and either the left side or the right side, from among the upper, lower, right, and left sides, are set as the light shielding regions as shown in FIG. 8B. That is, the light shielding regions are disposed based on the order (direction) of forming the patterns when the patterns are formed on the substrate, wherein the order is shown in FIG. 8A. In the first pattern forming process, when the imprint material protrudes from the pattern forming region, the area where the imprint material has protruded is not exposed or irradiated with a low exposure amount to avoid curing.

Subsequently, in the second pattern formation, the process of pressing the protruding imprint material by the mold is provided, and as a result, the protruding imprint material can be suppressed so as not to be higher than the pattern. In the first pattern forming process, the exposure on the partial region 114 is not performed or the partial region 114 is irradiated with a low exposure amount such that the imprint material of the partial region 114 can be deformed when being pressed by the mold in the second pattern formation. Here, the low exposure amount means an exposure amount for a certain level at which the protruding imprint material is not fully cured. On the substrate, the pattern is formed in a grid pattern with almost no gap.

As shown by arrows in FIG. 8A, pattern formation starts from the shot region in the lower right, pattern formation for the shot region in the bottom row of FIG. 8 is performed in order from right to left, and then pattern formation for the shot region in the second row from the bottom is performed in order from right to left. By sequentially repeating this operation, the pattern formation for the shot regions for the entire substrate is performed. The order of pattern formation is set such that a region adjacent to a final pattern forming region (shot region) is a region in which pattern formation has already been performed or a region outside of the substrate on which pattern cannot be formed.

For example, if an adjacent pattern forming region to be patterned next is not present due to the order of pattern formation on the substrate after all the patterns have been formed in the region in which a pattern can be formed in one substrate, auxiliary additional-exposure is performed. Accordingly, if the partial region remains unexposed after the pattern forming process has been performed on the region in which a pattern can be formed in the substrate, exposure light is applied again. That is, a process of irradiating the partial region 114 in the pattern forming region, in which the exposure amount is limited, with auxiliary exposure light, other than the exposure for the normal pattern formation, is added to provide even amounts of exposure light for the whole pattern forming region, thereby resulting in an improvement of the yield.

As an example of a method for applying the imprint material, a process of applying the imprint material to the entire surface of the substrate before the substrate is placed in the imprint apparatus may be provided. Thereby, the processing time in the imprint apparatus can be made shorter than that of the application method by using a dispenser. Or, the imprint material may be applied to a plurality of pattern forming regions, which are a part of the substrate, instead of applying the imprint material to the entire surface of the substrate.

As described above, according to the present embodiment, even when the imprint material protrudes at the outside of the pattern region, the protruding imprint material is prevented from being cured. Additionally, an exposure amount that causes a predetermined curing or more is not supplied to the imprint material at the end of the pattern in a state in which the mold is pressed against the imprint material. As a result, when the mold is removed from the imprint material, the height of the protruding imprint material can be reduced.

Furthermore, since the imprint material protruding at the outside of the pattern region is not exposed until the next pattern is formed and is exposed, the imprint material is volatilized, and the imprint material protruding at the outside of the pattern region is not cured in a state in which the imprint material is higher than the height of the pattern to be formed. Therefore, it is possible to obtain advantageous effect that defects are reduced in the subsequent processes.

Next, a method for manufacturing an article (for example, a semiconductor IC element, a liquid crystal display element, and MEMS) using the mold described above will be described. The article is manufactured by executing a post-processing process (process of manufacturing an article from the imprinted substrate) by using the mold described above through a process of pressing and demolding the substrate to which the imprint material has been applied. The post-processing process includes etching, resist stripping, dicing, bonding, packaging, development, and the like. According to the method of manufacturing an article using the present invention, damage to the mold or a pattern defect due to the protruding imprint material can be prevented, resulting in improving the yield and manufacturing an article having a quality that is higher than that of the conventional article.

While the present invention has been described with reference to exemplary embodiments, it is to be understood that the invention is not limited to the disclosed exemplary embodiments. Note that, regarding part or all of the control in the present embodiment, a computer program that realizes the functions of the above-described embodiments may be supplied to the image pickup apparatus via a network or various storage media. A computer (for example, CPU and MPU) in the image pickup apparatus may read out and execute the program. In this case, the program and the storage medium storing the program configure the present invention.

This application claims the benefit of Japanese Patent Application No. 2020-088834 filed on May 21, 2020, which is hereby incorporated by reference herein in its entirety.

What is claimed is:

1. An imprint method comprising:
    a first pattern forming process of arranging an imprint material on a first pattern forming region on a substrate and bringing a mold having a pattern into contact with the imprint material on the first pattern forming region on the substrate such that a first pattern is formed on the first pattern forming region and a portion of protruding imprint material is formed outside of the first pattern forming region;
    a first exposure process of exposing the imprint material on the first pattern forming region in which the first pattern has been formed by the first pattern forming process and making an amount of exposure for the imprint material on a partial region of the first pattern forming region smaller than an amount of exposure for the imprint material on the other region of the first pattern forming region such that the imprint material on the partial region of the first pattern forming region and the portion of protruding imprint material formed outside of the first pattern forming region are not cured by the first exposure process;
    a second pattern forming process, performed after the first pattern forming process, of arranging an imprint material on a second pattern forming region on the substrate and bringing the mold into contact (i) with the imprint material on the second pattern forming region on the substrate to form a second pattern, (ii) with the portion of protruding imprint material formed outside of the first pattern forming region, and (iii) with the imprint material on the partial region of the first pattern forming region, the second pattern forming region and the first pattern forming region being horizontally-adjacent pattern forming regions on the substrate; and a second exposure process of (i) exposing the imprint material on the second pattern forming region in which the second pattern has been formed by the second pattern forming process and (ii) exposing the uncured imprint material on the partial region of the first pattern forming region.

2. The imprint method according to claim 1, wherein the partial region of the first pattern forming region is a region at an end portion of the first pattern forming region and is adjacent to the second pattern forming region.

3. The imprint method according to claim 1, wherein the partial region of the first pattern forming region is a region that does not correspond to a circuit pattern or an alignment mark disposed on the mold.

4. The imprint method according to claim 1, wherein the first exposure process uses a blade for shielding exposure light by disposing the blade between a light source and the mold to limit an amount of exposure for the partial region of the first pattern forming region.

5. The imprint method according to claim 1, further comprising a process of limiting the amount of exposure for the partial region of the first pattern forming region by using a digital micromirror device (DMD).

6. The imprint method according to claim 1, wherein a light shielding material is disposed on the mold to limit the exposure amount for the partial region of the first pattern forming region.

7. The imprint method according to claim 1, wherein the partial region of the first pattern forming region includes an end portion vertically adjacent to pattern forming regions of a next line on the substrate.

8. The imprint method according to claim 1, further comprising a process of applying auxiliary exposure light to a partial region of a final pattern forming region on the substrate.

9. The method according to claim 1, wherein, in the first exposure process, the imprint material of the partial region of the first pattern forming region is not exposed.

10. The imprint method according to claim 1, wherein the second exposure process further includes (iii) exposing the uncured portion of protruding imprint material formed outside of the first pattern forming region.

11. The imprint method according to claim 1, wherein the second exposure process is performed while the mold is contacted with (i) the imprint material on the second pattern forming region, (ii) the uncured imprint material on the partial region of the first pattern forming region, and (iii) the uncured portion of protruding imprint material formed outside of the first pattern forming region.

12. A method for manufacturing an article comprising:

a first pattern forming process of arranging an imprint material on a first pattern forming region on a substrate and bringing a mold having a pattern into contact with the imprint material on the first pattern forming region on a substrate such that a first pattern is formed on the first pattern forming region and a portion of protruding imprint material is formed outside of the first pattern forming region;

a first exposure process of exposing the imprint material on the first pattern forming region in which the first pattern has been formed by the first pattern forming process and making an amount of exposure for the imprint material on a partial region of the first pattern forming region smaller than an amount of exposure for the imprint material on the other region of the first pattern forming region such that the imprint material on the partial region of the first pattern forming region and the portion of protruding imprint material formed outside of the first pattern forming region are not cured by the first exposure process;

a second pattern forming process, performed after the first pattern forming process, of arranging an imprint material on a second pattern forming region on the substrate and bringing the mold into contact with (i) an imprint material on the second pattern forming region on the substrate to form a second pattern (ii) with the portion of protruding imprint material formed outside of the first pattern forming region, and (iii) with the imprint material on the partial region of the first pattern forming region, the second pattern forming region and the first pattern forming region being horizontally-adjacent pattern forming regions on the substrate;

a second exposure process of (i) exposing the imprint material on the second pattern forming region in which the second pattern has been formed by the second pattern forming process, and (ii) exposing the uncured imprint material on the partial region of the first pattern forming region; and a development process of developing the substrate on which the first and second patterns have been formed by the first and second pattern forming processes.

* * * * *